United States Patent
Pan et al.

(10) Patent No.: US 6,395,620 B1
(45) Date of Patent: *May 28, 2002

(54) METHOD FOR FORMING A PLANAR SURFACE OVER LOW DENSITY FIELD AREAS ON A SEMICONDUCTOR WAFER

(75) Inventors: Pai-Hung Pan; Scott G. Meikle, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/728,269

(22) Filed: Oct. 8, 1996

(51) Int. Cl.[7] .............................................. H01L 21/76
(52) U.S. Cl. ..................... 438/435; 438/633; 438/699
(58) Field of Search ................................ 438/633, 699, 438/424, 435

(56) References Cited

U.S. PATENT DOCUMENTS

| | | | | |
|---|---|---|---|---|
| 4,662,064 A | * | 5/1987 | Hsu et al. ..................... 29/591 |
| 4,836,885 A | * | 6/1989 | Breiten et al. ............... 156/643 |
| 4,876,217 A | * | 10/1989 | Zdebel ......................... 437/67 |
| 4,954,459 A | * | 9/1990 | Avanzino et al. ........... 437/228 |
| 4,962,064 A | * | 10/1990 | Haskell et al. .............. 438/699 |
| 5,139,608 A | * | 8/1992 | Grivna ........................ 156/643 |
| 5,173,439 A | * | 12/1992 | Dash et al. ................... 437/67 |
| 5,175,122 A | * | 12/1992 | Wang et al. ................ 438/699 |
| 5,245,213 A | * | 9/1993 | Huang ........................ 257/638 |
| 5,272,115 A | * | 12/1993 | Sato ........................... 437/228 |
| 5,272,117 A | | 12/1993 | Roth et al. .................. 437/228 |
| 5,529,950 A | * | 6/1996 | Hoenlein et al. ........... 437/170 |
| 5,663,107 A | * | 9/1997 | Peschke et al. ............. 438/692 |
| 5,665,202 A | * | 9/1997 | Subramanian et al. ...... 438/692 |
| 5,721,172 A | * | 2/1998 | Jang et al. .................. 438/424 |
| 5,863,828 A | * | 1/1999 | Snyder ....................... 438/437 |
| 5,885,900 A | * | 3/1999 | Schwartz .................... 438/697 |

FOREIGN PATENT DOCUMENTS

JP  8-236615  *  9/1996  ......... H01L/21/762

OTHER PUBLICATIONS

Blumenstock et al., "Shallow trench isolation for ultra–large–scale integrated devices," J. Vac. Sci. Technology, Jan./Feb. 1994, pp. 54–48.

Davari et al., "A Variable–Size Shallow Trench Isolation (STI) Technology With Diffused Sidewall Doping for Submicron CMOS," 1988, IEEE.

* cited by examiner

*Primary Examiner*—Olik Chaudhuri
*Assistant Examiner*—Erik Kielin
(74) *Attorney, Agent, or Firm*—Perkins Coie LLP

(57) ABSTRACT

A method for forming a planar surface over low density fields on a semiconductor wafer that has a contoured front face with a low region between high points. In accordance with one embodiment of the method, a fill layer is deposited over the front face to conform to the contour of the front face and form a depression in the fill layer positioned above the low region. A cover layer is then deposited over the fill layer to fill at least a portion of the depression. The cover and fill layers are selectively removable from the wafer using suitable etching and planarization processes. A portion of the cover layer is then selectively removed from the fill layer to an intermediate endpoint at which the upper portions of the fill layer are exposed, and the only remaining portion of the cover layer is positioned in the depression of the fill layer. The upper exposed portions of the fill layer are then removed from the wafer to form a shoulder on the fill layer over the high points of the wafer, and a raised support feature extending upwardly from the shoulder over the low region. After the raised support feature is formed, the wafer is planarized to a final endpoint. The raised support feature supports the polishing substrate over the low region to substantially prevent dishing over the low region, and thus form a uniformly planar surface over the low density field on the wafer without lithographic processing techniques.

30 Claims, 8 Drawing Sheets ical field, and the distance between the device features. In general, more compressible polishing substrates and larger distances between device features produce greater dishing on the surface of the wafer. Therefore, it is difficult to form a planar surface over low density fields.

METHOD FOR FORMING A PLANAR SURFACE OVER LOW DENSITY FIELD AREAS ON A SEMICONDUCTOR WAFER

TECHNICAL FIELD

The present invention relates to semiconductor processing, and more particularly, to forming a globally planar surface over low density field areas on the wafer.

BACKGROUND OF THE INVENTION

Chemical-mechanical planarization ("CMP") processes remove material from the surface of a wafer in the production of integrated circuits. In a typical CMP process a wafer is exposed to an abrasive medium under controlled chemical, pressure, velocity and temperature conditions. One abrasive medium used in CMP processes is a slurry solution with small, abrasive particles that abrade the surface of the wafer, and chemicals that etch and/or oxidize the surface of the wafer. Another abrasive medium used in CMP processes is a generally planar planarizing substrate made from a relatively porous matrix material, such as blown polyurethane. To increase the abrasiveness of planarizing substrates, abrasive particles are embedded into the matrix material. Thus, when the wafer moves with respect to the abrasive medium, material is removed from the surface of the wafer mechanically by the abrasive particles in the substrate and/or the slurry, and chemically by the chemicals in the slurry.

In some new CMP processes, a planarizing liquid without abrasive particles is used with an abrasive substrate covered with fixed abrasive particles. The present invention is applicable to any CMP process that removes material from the surface of the wafer.

One problem with CMP processing is that the surface of the wafer may not be uniformly planar over field areas that have a low density of device features. The surface over low density field areas is typically not as planar as that over array areas with a high density of device features because the greater distance between high points on the wafer in low density fields allows the polishing substrate to dish between the features.

FIG. 1 illustrates a specific application of a CMP process over a low density field on a wafer 20 that has a substrate 22 and a number of features 24 positioned apart from one another by a distance "d". The top of the substrate 22 and the top of the device features 24 define a front face 26 of the wafer 20. In the low density field on the wafer 20, the distance d between the features 24 is relatively large such that the front face 26 has a low region 27 between the device features 24 and high points 28 defined by the tops of the device features 24. The substrate 22 and the device features 24 are covered by a fill layer 30 that conforms to the contour of the front face 26 to form a depression 34 over the low region 27 and a top surface 36 over the high points 28 of the front face 26.

When the wafer 20 is planarized with a CMP process, a planarizing substrate 40 removes material from the fill layer 30 to form a finished surface over the substrate 22 and the device features 24. The polishing substrate 40, however, partially conforms to the profile of the fill layer 30 such that a planarizing surface 42 of the planarizing substrate 40 penetrates into the depression 34 of the fill layer 30. As the CMP process continues, the profile of the depression 34 is at least partially maintained throughout the fill layer 30 until a finished surface 32(a) is formed over the substrate 22 and the device features 24. The finish surface 32(a) accordingly "dishes" between the device features 24 such that the elevation of the surface 32(a) over the low region 27 is lower than over the device features 24.

The extent of "dishing" is a function of the compressibility of the polishing substrate 40 and the distance between the device features 24. In general, more compressible polishing substrates and larger distances between device features produce greater dishing on the surface of the wafer. Therefore, it is difficult to form a planar surface over low density fields.

One existing technique for reducing dishing over low density fields is to form raised support structures over the low regions in the low density fields. In addition to the structure shown in FIG. 1, a raised support feature is fabricated over the low region in the low density field by:

(1) depositing a cover layer over the fill layer;

(2) depositing a top layer over the cover layer;

(3) photo-patterning resist on the top layer aligned with the low region of the low density field;

(4) selectively etching the top layer to expose the cover layer over the high points on the wafer;

(5) removing the remaining resist from the wafer to form a mask segment from the remaining portion of the top layer over the low region;

(6) performing a first CMP of the cover layer which endpoints at the mask segment of the top layer over the low density field;

(7) etching exposed areas of the fill layer and the mask segment from the wafer to form a raised feature over the low region; and (8) performing a second CMP of the raised feature to a final endpoint.

One problem with forming raised support features using this technique is that lithographic processing is expensive. Lithographic processing machines are typically very expensive, and lithographic processes are time-consuming because the resist material must be deposited, patterned, and then washed to form a mask in the desired pattern.

Another problem with this technique is that the lithographic pattern may not be appropriately aligned with the low regions on the surface of the wafer. The resulting raised support features may accordingly be misaligned with the low regions of the front face, which may exacerbate the dishing in the low region.

Still another problem of this technique is that the cover layer must be deposited to a precise thickness so that the mask segments over the low regions are positioned at the desired end point. In some designs, for example, it may be desirable to deposit a relatively thin cover layer to reduce material costs and processing time. Such thin cover layers, however, may not be thick enough to position the mask segments at a desired endpoint. Thus, lithographically patterning resist over the low density fields also restricts the design flexibility of integrated circuits and semiconductor manufacturing processes.

In light of the need to form a planar surface over low density fields, and the problems associated with lithographic processing techniques, it would be desirable to develop a method for forming a globally planar surface over low density fields on a wafer that reduces costs, improves accuracy, and provides design and processing flexibility.

SUMMARY OF THE INVENTION

The present invention is a method for forming a planar surface over low density fields on a semiconductor wafer that has a contoured front face with a low region between high points. In accordance with one embodiment of the method, a fill layer is deposited over the front face to conform to the contour of the front face and form a depression in the fill layer positioned above the low region. A cover layer is then deposited over the fill layer to fill at least a portion of the depression. The cover and fill layers are selectively removable from the wafer using suitable etching and planarization processes. A portion of the cover layer is then selectively removed from the fill layer to an intermediate endpoint at which the upper portions of the fill layer are exposed, and the only remaining portion of the cover layer is positioned in the depression of the fill layer The upper exposed portions of the fill layer are then removed from the wafer to form a shoulder on the fill layer over the high points of the wafer and a raised support feature extending upwardly from the shoulder over the low region. After the raised support feature is formed, the wafer is planarized to a final endpoint. The raised support feature supports the polishing substrate over the low region to substantially prevent dishing over the low region, and thus the method of the invention forms a uniformly planar surface over the low density field on the wafer without lithographic processing techniques.

DETAILED DESCRIPTION OF THE INVENTION

The present invention is a method and a semiconductor wafer structure for forming a uniformly planar surface over low density fields with large low regions on the front face of a wafer. An important aspect of the invention is to form raised support features over the low regions without lithographically patterning resist or other materials in alignment with the low regions. Instead, the present invention forms a self-aligned pattern of a hard mask segments over the low regions by depositing a selectively removable cover layer over the fill layer, and then selectively removing a desired portion of the cover layer with a one-step CMP process to form the mask segments in depressions on the fill layer. The present invention accordingly forms a self-aligned mask without expensive and time-consuming lithographic processing.

FIGS. 2–16, in which like reference numbers refer to like parts throughout the various figures, illustrate methods and raised support features formed in accordance with the invention.

Figure 1:
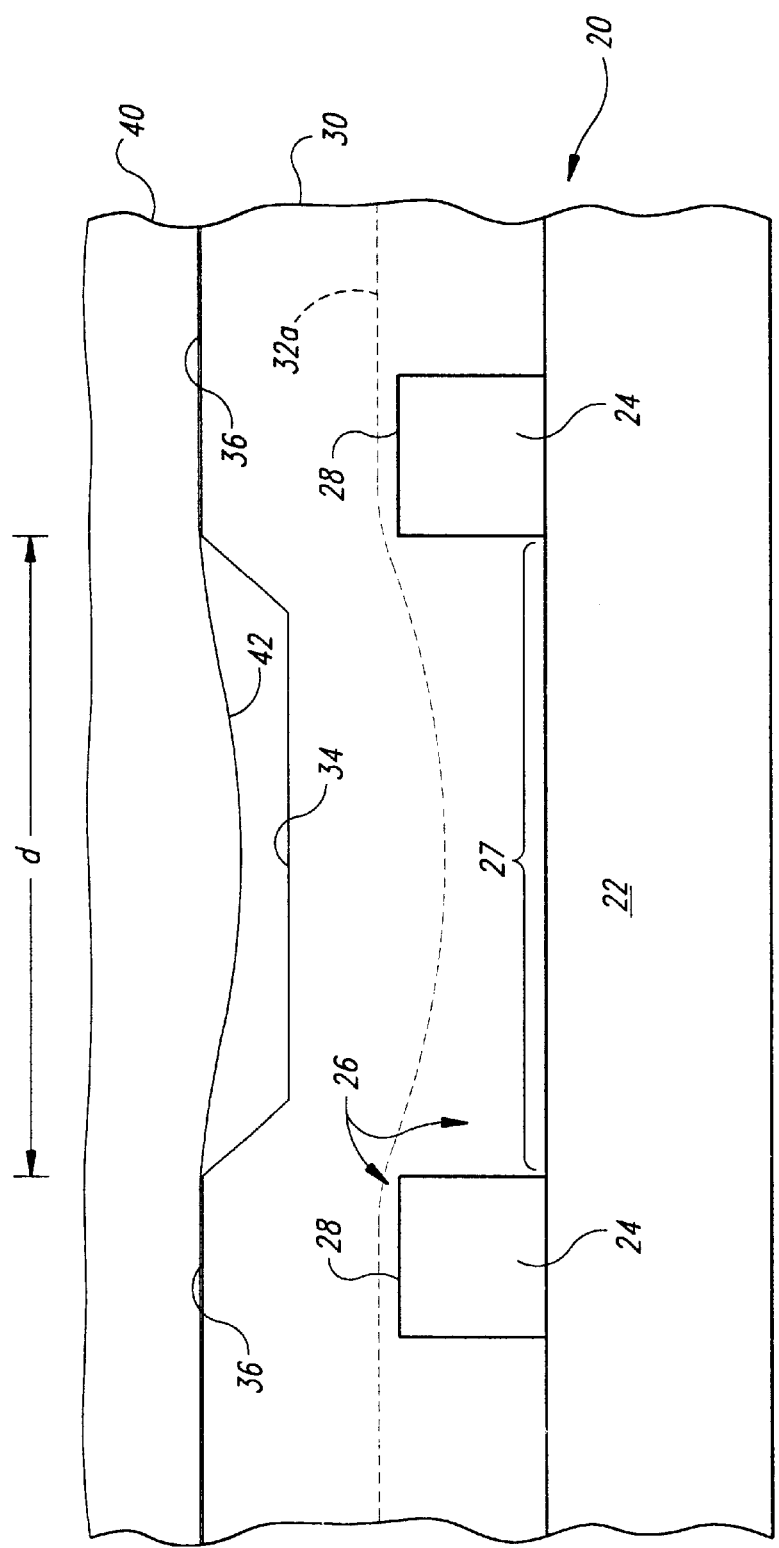
FIG. 1 is a partial schematic cross-sectional view of a film stack over a low density field of a semiconductor wafer being planarized in accordance with the prior art.
Figure 2:
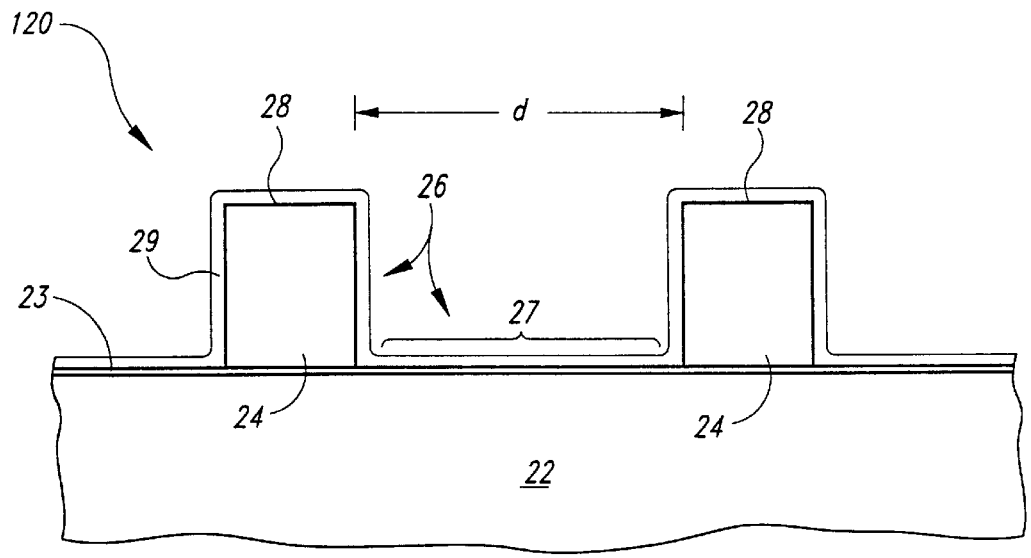
FIG. 2 is a partial schematic cross-sectional view of a low density field on a semiconductor wafer upon which a planar surface is formed in accordance with a method of the invention.

FIG. 2 illustrates a low density field area on a wafer 120 upon which a planar surface is formed in accordance with the invention. The wafer 120 is similar to the wafer 20 shown in FIG. 1, and like reference numbers refer to like parts in both wafers. The device features 24 are separated from one another by a distance "d", which, in a typical low density field, is approximately 3 to 10 μm. In addition to the structure described above in FIG. 1, a stop on feature layer 29 is preferably deposited over the front face 26 of the wafer 120 to endpoint a chemical-mechanical planarization process, as disclosed in U.S. Pat. No. 5,449,314, entitled "METHOD OF CHEMICAL MECHANICAL POLISHING FOR DIELECTRIC LAYERS," which is herein incorporated by reference.

Figure 3:
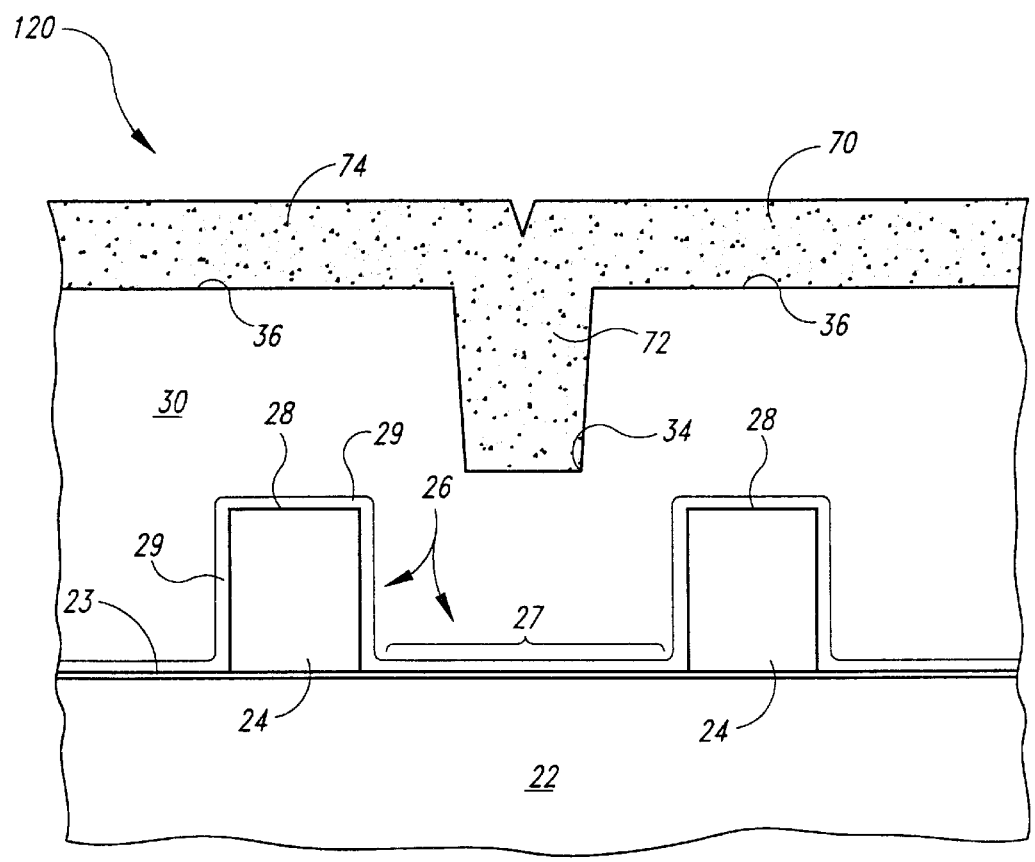
FIG. 3 is a partial schematic cross-sectional view of a film stack over the low density field on the semiconductor wafer of FIG. 2 at a point in a method of the invention.

FIG. 3 illustrates the wafer 120 at a point in one method for forming a globally planar surface on the wafer 120 in accordance with the invention. A fill layer 30 is deposited over the front face 26 of the wafer 120 to provide material from which a planar surface is later formed on the wafer 120. The fill layer 30 is a conformal layer that substantially conforms to the contour of the front face 26; the fill layer accordingly has a depression 34 over the low region 27, and a top surface 36 over the high points 28 of the front face 26. A cover layer 70 is then deposited over the fill layer 30. The cover layer 70 has a lower portion 72 that fills the depression 34 in the fill layer 30, and an upper portion 74 above the top surface 36 of the fill layer 30. The fill layer 30 and cover layer 70 preferably are selectively removable from the wafer with appropriate chemical-mechanical planarization or etching processes. Thus, the fill layer 30 and the cover layer 70 are preferably made from different materials that react with different chemicals to provide a large difference in removal rates when appropriate chemical compositions are used.

The fill layer 30 and the cover layer 70 may be made from any combination of insulative, conductive, and semiconductive materials that provide the desired selectivity between the two layers. In one embodiment, the cover layer 70 is made from polysilicon, and the fill layer 30 is made from an insulative material such as silicon oxide, borophosphate silicon glass ("BPSG"), or tetraethyl ortho silicate ("TEOS"). In another embodiment, the fill layer 30 may be made from a silicon oxide and the cover layer 70 may be made from silicon nitride. The present invention, however, is not limited to these embodiments, but rather includes any suitable combination of materials that may be selectively removed from the wafer.

Figure 4:
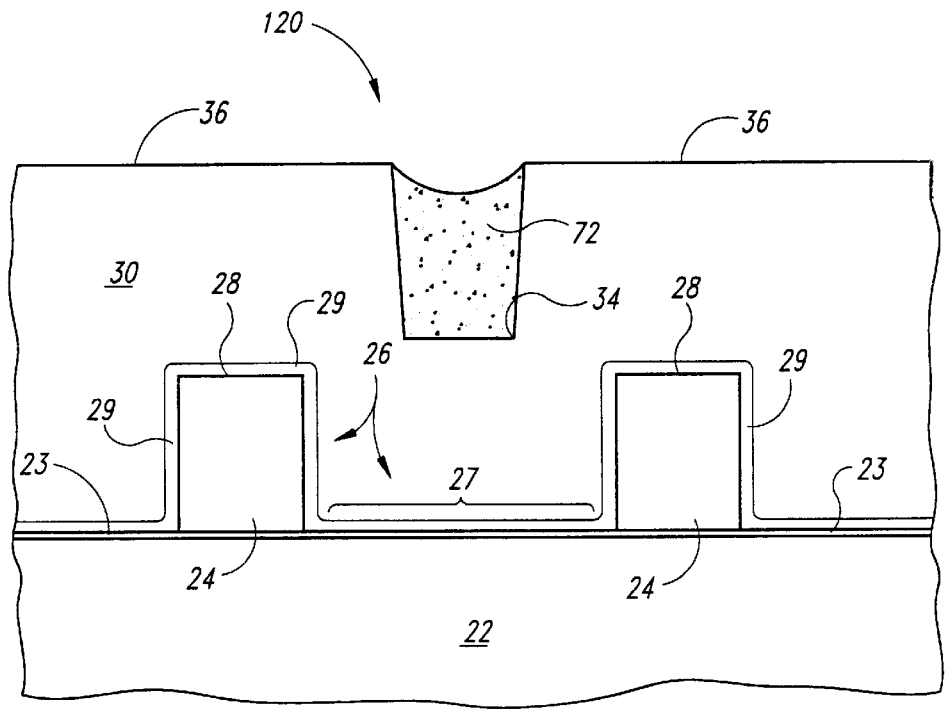
FIG. 4 is a partial schematic cross-sectional view of the film stack over the low density field on the semiconductor wafer of FIG. 3 at another point in a method of the invention.

FIG. 4 illustrates the wafer 120 at a subsequent point in the method of FIG. 3. The upper portion 74 of the cover layer 70 has been removed from the wafer 120 to isolate the lower portion 72 of the cover layer 70 in the depression 34 in the fill layer 30, and expose the top surface 36 of the fill layer 30. The isolated lower portion 72 of the lower layer 70 accordingly creates a self-aligned mask segment over the lower region 27.

To selectively remove the upper portion 74 of the cover layer 70, the cover layer 70 is preferably planarized with a chemical-mechanical planarization process using a slurry that is selective to the cover layer 70. In another embodiment, the upper portion 74 of the cover layer 70 is selectively removed from the fill layer 30 with a wet spin etching process that uses an etchant selective to the cover layer 70. One suitable chemical-mechanical planarization process uses a Rodel QLDK8982 slurry selective to silicon oxide, manufactured by Rodel Corporation of Newark, Del.

Figure 5:
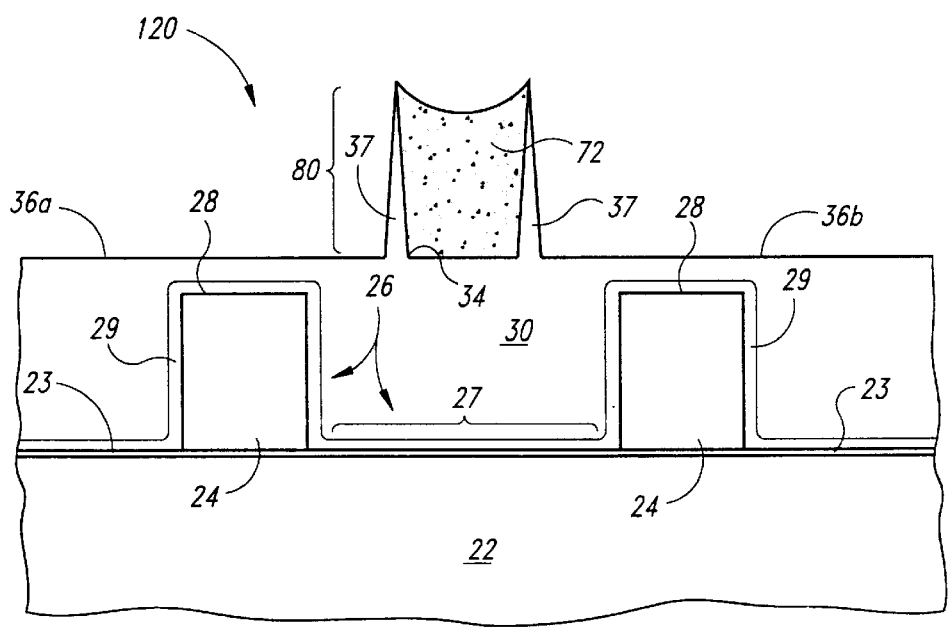
FIG. 5 is a partial schematic cross-sectional view of the film stack over the low density field on the semiconductor wafer of FIG. 4 at another point in a method of the invention.

FIG. 5 illustrates the wafer 120 at a subsequent point in the method illustrated in FIGS. 3 and 4. At this point of the method, a portion of the fill layer 30 is selectively removed from the wafer 120 to form a raised support feature 80 over the low region 27 of the front face 26. The raised support feature 80 is generally constructed from the mask segment 72 and a wall 37 formed from the fill layer 30. The selective etching process also forms a new top surface on the fill layer 30 that defines a shoulder 36(a) over the high points 28 of the front face 26. The shoulder 36(a) is preferably lower than the lower most portion of the mask segment 72 so that the mask segment 72 may be completely removed from the wafer 120 in subsequent processing steps. The invention, however, is not limited to positioning the shoulder 36(a) below the bottom of the mask segment 72, as other shoulder elevations may also be used. The fill layer 30 preferably is selectively etched with an etchant selective to the material from which the fill layer 30 is made. When the mask segment 72 is made from polysilicon and the fill layer 30 is made from either TEOS, BPSG, or a silicon oxide, the fill layer 30 may be isotropically etched with an etchant such as $CF_4$.

Figure 6:
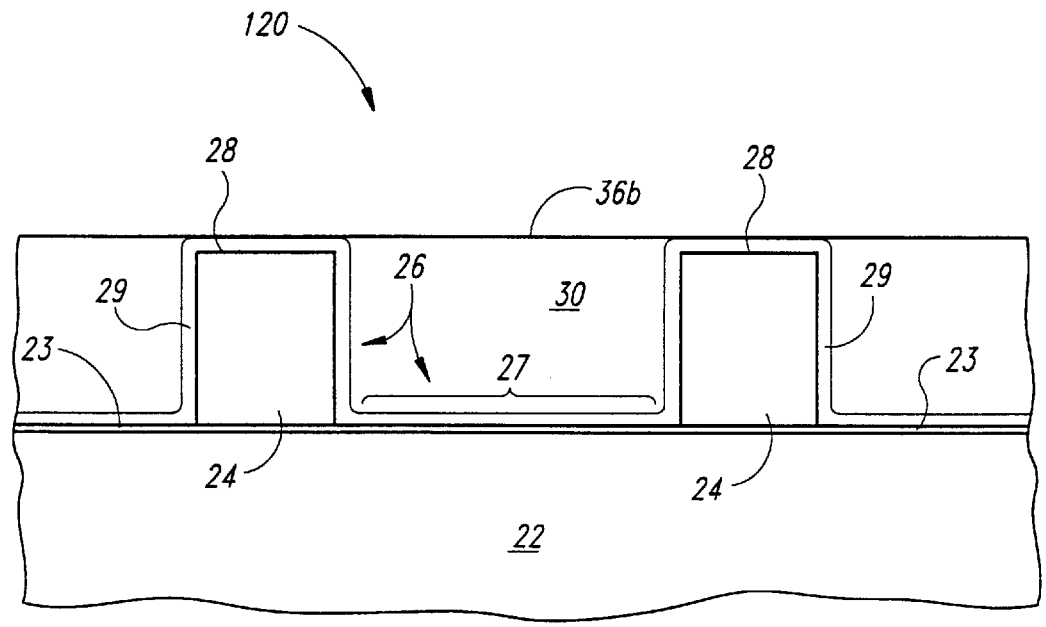
FIG. 6 is a partial schematic cross-sectional view of a finished surface over the low density field on the semiconductor wafer of FIG. 5 at another point in a method of the invention.

FIG. 6 illustrates the wafer 120 at a final endpoint in the method illustrated in FIGS. 3–5. A highly planar surface 36(b) is formed by planarizing the wafer 120 to a final endpoint defined by the top surface of the stop-on-feature layer 29. During the planarization of the fill layer 30, the raised support feature 80 (shown in FIG. 5) supports the planarizing substrate (not shown) over the low region 27 to prevent dishing in the fill layer 30 over the low region 27. In operation, the raised support feature 80 planarizes at a much higher rate than the shoulder 36(a) (shown in FIG. 5) because CMP processes remove small, high points on a wafer much faster than flat areas. Therefore, most of the raised support feature 80 is removed from the wafer 120 before material is removed from the shoulder 36(a) to produce a uniformly planar surface over the low region 27.

One advantage of a preferred embodiment the present invention is that it is more cost efficient than photolithographically patterning resist over low density fields on a wafer. The preferred embodiment of the present invention forms a pattern of hard mask segments over low density fields by depositing a selectively removable cover layer over the fill layer, and then selectively removing a desired portion of the cover layer to form mask segments in the depressions of the fill layer. Photolithographic processing, however, requires: (1) depositing a resist material over the fill layer; (2) aligning a highly exact pattern on the resist material; (3) removing the undesired portions of the resist material from the wafer; (4) etching the material protected by the patterned resist material; and (5) removing the resist material from the wafer. Moreover, lithographic processing requires expensive equipment to pattern the resist layer to within necessary critical dimensions. The preferred embodiment of the present invention, therefore, produces a precisely aligned mask over the wafer in fewer steps and with less expensive equipment.

Another advantage of the preferred embodiment of the present invention is that the mask segments are self-aligned with the depressions in the fill layer. By filling the depressions in the fill layer with the material of the cover layer, and then planarizing the cover layer to a level at which the only remaining portions of the cover layer are located in the depressions, the mask segment is inherently aligned with the depression. In photolithographic processes, however, the pattern of mask segments is not self-aligned because the lithographic pattern is a function of the lithographic equipment, and not the actual typography of the wafer. Mask segments formed by lithographic processes may accordingly be misaligned with the depressions in the surface of the wafer. Therefore, the preferred embodiment of the present invention ensures that the raised features are accurately positioned over the low regions on the front face of the wafer.

Still another advantage of the preferred embodiment of the invention is that the cover layer may be deposited to any thickness without affecting the endpoint of the first CMP step. Because a polish-stop is not patterned on the cover layer over the low region, the first CMP step does not necessarily endpoint at the surface of the cover layer over the low region. Instead, the first CMP step of the present invention stops at a desired endpoint by planarizing the wafer for an adequate amount of time to expose the upper surface 36 of the fill layer 30 and to isolate the mask segment 72 in the depression 34. Thus, the preferred embodiment of the present invention recognizes that it is not necessary to provide a polish-stop for the first CMP step because this is an intermediate end point and not a final finished surface of the wafer.

Figure 7:
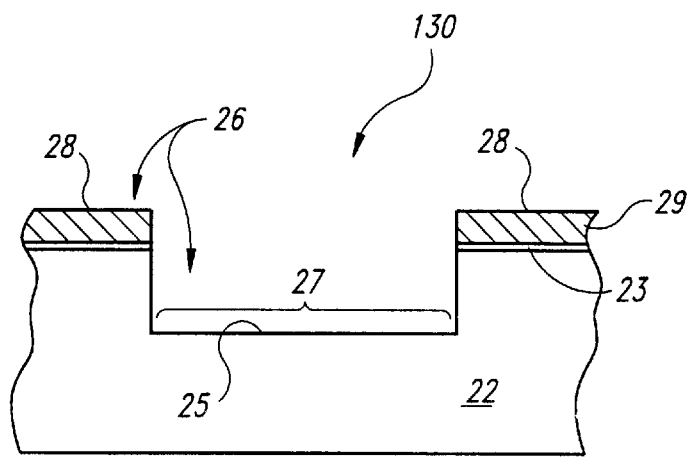
FIG. 7 is a partial schematic cross-sectional view of another low density field on a semiconductor wafer upon which a planar surface is formed in accordance with another method of the invention.

FIG. 7 illustrates another low density field on a wafer 130 upon which a planar surface is formed in accordance with the invention. The wafer 130 has a substrate 22 upon which an oxide layer 23 and a polish-stop layer 29 are deposited. A shallow trench 25 is formed into the substrate 22 to provide a channel on the wafer 130 in which a dielectric material is deposited to fabricate a shallow trench isolation structure. The width of the trench 25 is a distance "d", which, in the case of a low density field, is generally between 3 and 10 $\mu$m. The surface of the trench 25 and the surface of the polish-stop layer 29 define the front face 26 of the wafer 130. Accordingly, the low region 27 is the area in the trench 25, and the high points 28 are the surface of the polish-stop layer 29.

Figure 8:
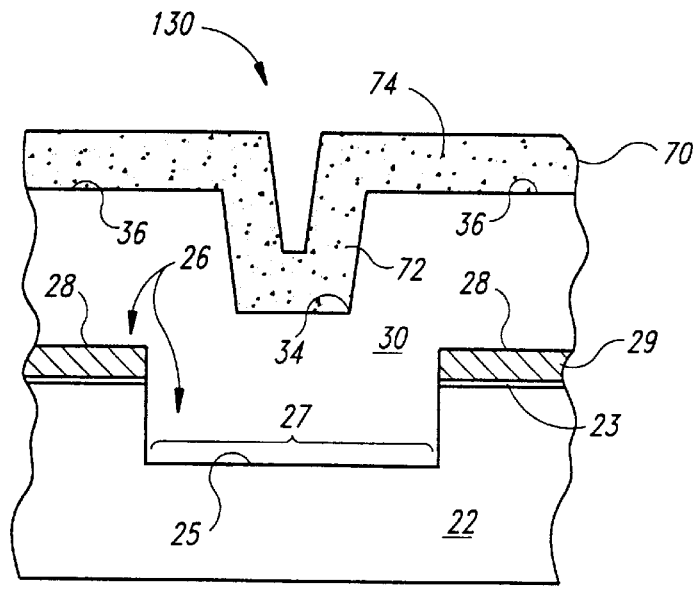
FIG. 8 is a partial schematic cross-sectional view of a film stack over the low density field of the semiconductor of FIG. 7 at a point in a method of the invention.
Figure 9:
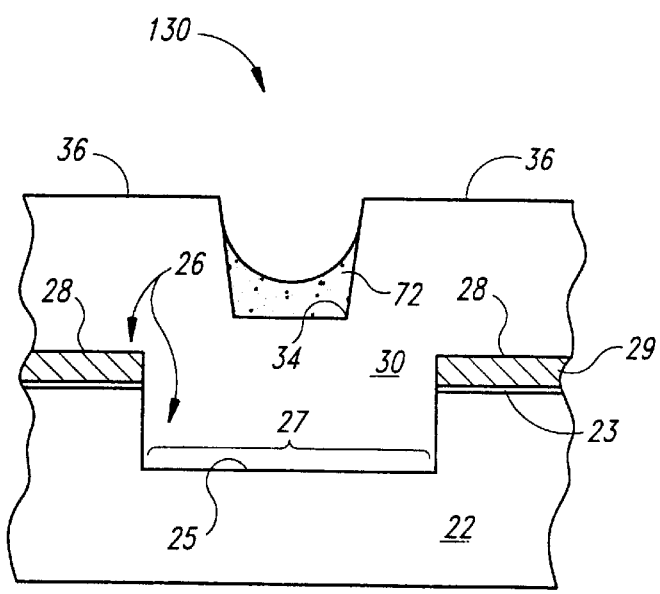
FIG. 9 is a partial schematic cross-sectional view of the film stack over the low density field on the semiconductor of FIG. 8 at another point in a method of the invention.
Figure 10:
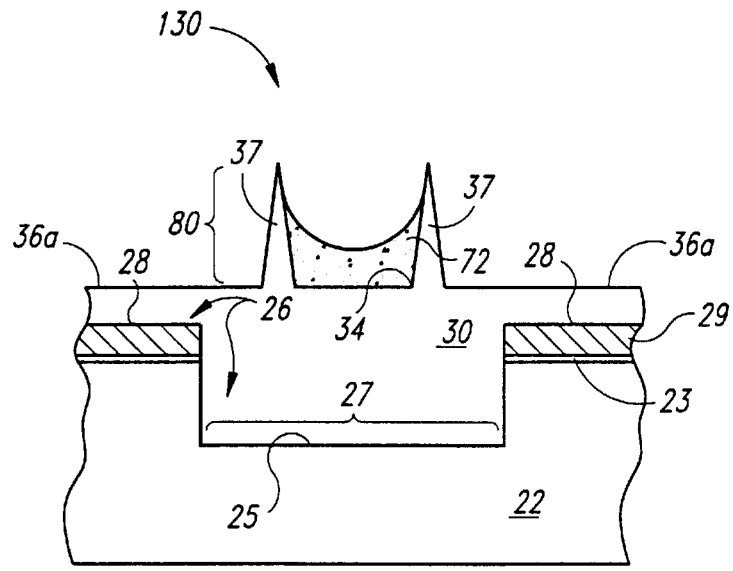
FIG. 10 is a partial schematic cross-sectional view of the film stack over the low density field on the semiconductor of FIG. 9 at another point of a method of the invention.
Figure 11:
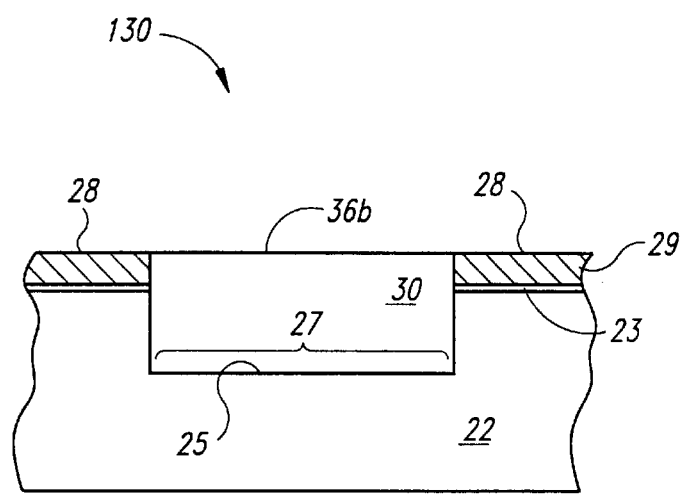
FIG. 11 is a partial schematic cross-sectional view of a finished surface over the low density field of the semiconductor wafer of FIG. 10 at another point of a method of the invention.

FIGS. 8–11 illustrate a method for forming a planar surface over the trench 25 of the wafer 130 in the same manner as the planar surface 36(b) is formed over the wafer 120 of FIGS. 2–6. Referring to FIG. 8, the wafer 130 has a conformal fill layer 30 disposed over the front face 26 to form a depression 34 and an upper surface 36 on the fill layer 30, and a cover layer 70 disposed over the fill layer 30 to form an upper portion 74 over the upper surface 36 and a mask segment 72 in the depression 34. As shown in FIG. 9, the upper portion 74 (shown in FIG. 8) of the cover layer 70 is selectively removed from the wafer 130 to leave only the mask segment 72 isolated in the depression 34 of the fill layer 30. FIG. 10 illustrates a raised support feature 80 formed over the trench 25 by selectively etching the fill layer 30 around the mask segment 72. As with the raised support feature 80 of FIG. 5, the raised support feature 80 on the wafer 130 preferably has a wall 37 extending upwardly from a shoulder 36(a) to form a basin around the mask segment 72. FIG. 11 shows the wafer 130 after it has been planarized by a CMP process to a final endpoint at which a finished surface 36(b) is formed from on the fill layer 30 over the trench 25. The final endpoint is preferably on the polish-stop layer 29, which is typically silicon nitride. It will be appreciated that the materials of the fill layer 30 and the cover layer 70, and the CMP processing steps and selective etching steps, may be the same as described above with respect to the wafer 120 of FIG. 2–6.

Figure 12:
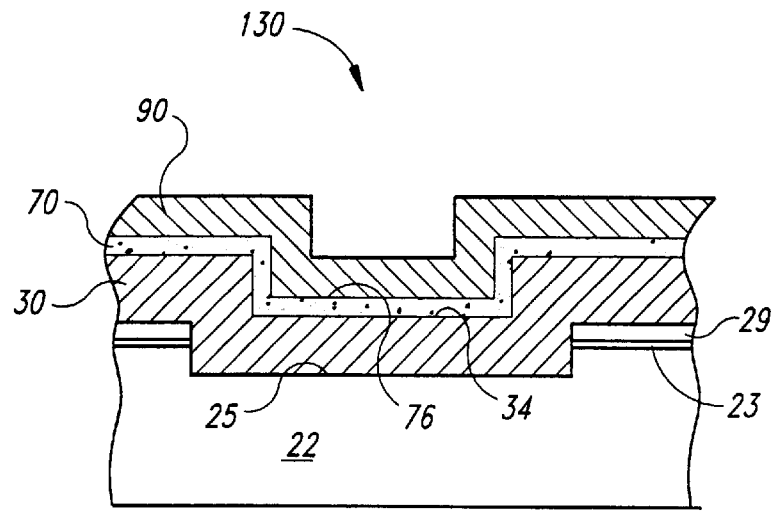
FIG. 12 is a partial schematic cross-sectional view of another film stack over a low density field on a semiconductor wafer at one point in another method in accordance with the invention.

FIGS. 12–16 illustrate another method for forming a planar surface over the shallow trench isolation structure 25 on the wafer 130. Referring to FIG. 12, a conformal fill layer 30 is deposited over the substrate 22, a conformal intermediate cover layer 70 is deposited over the fill layer 30, and an upper cover layer 90 is deposited over the intermediate cover layer 70. The fill layer 30 accordingly has a depression 34 over the trench 25, and the intermediate cover layer 70 has a recess 76 over the depression 34 in the fill layer 30. The fill layer 30 is selectively removable from the wafer 130 with respect to the intermediate cover layer 70, and the intermediate cover layer 70 is selectively removable from the wafer 130 with respect to the upper cover layer 90. The fill layer 30 and the intermediate cover layer 70 are generally of the same materials that are used to form the fill layers 30 and cover layers 70, respectively, in the embodiments of FIGS. 2–11. The fill layer 30 and the upper cover layer 90 preferably are made from the same material, but the fill layer 30, intermediate cover layer 70, and the upper cover layer 90 may all be made from different materials.

Figure 13:
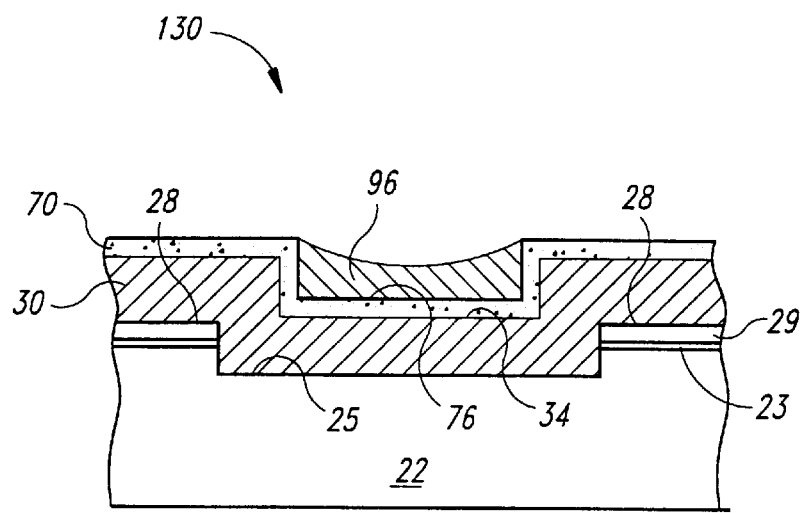
FIG. 13 is a partial schematic cross-sectional view of the film stack of FIG. 12 at another point in a method of the invention.
Figure 14:
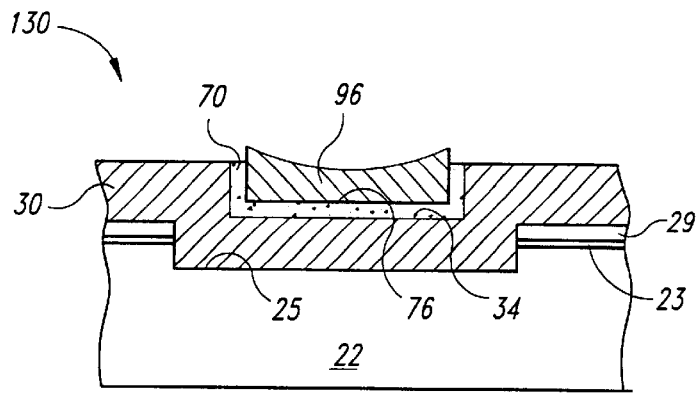
FIG. 14 is a partial schematic cross-sectional view of the film stack of FIG. 13 at another point in a method of the invention.

FIG. 13 illustrates the wafer 130 after it has been planarized with a CMP process to isolate a mask segment 96 from the upper layer 90 in the recess 76 of the intermediate cover layer 70. The CMP process is preferably a selective CMP process, as discussed above with respect to the wafer 120 in FIG. 4. After the mask segment 96 is isolated from the rest of the upper cover layer 90, the upper portion of the intermediate cover layer 70 is selectively removed from the surface of the wafer 130 by either a CMP process or an etching process to provide the structure shown in FIG. 14. The intermediate cover layer 70 may be made from a material with a higher removal rate than the upper cover layer 90 so that the upper portions of the intermediate layer 70 are removed faster than the top of the mask segment 96. As a result, less dishing will occur in the mask segment itself when the intermediate cover layer is removed by CMP processing. The CMP and etching processes are preferably the same as those discussed above with respect to FIGS. 4 and 5. In a preferred embodiment, the etching process is a Reactive Ion Etch that is a highly directional anisotropic etching process.

Figure 15:
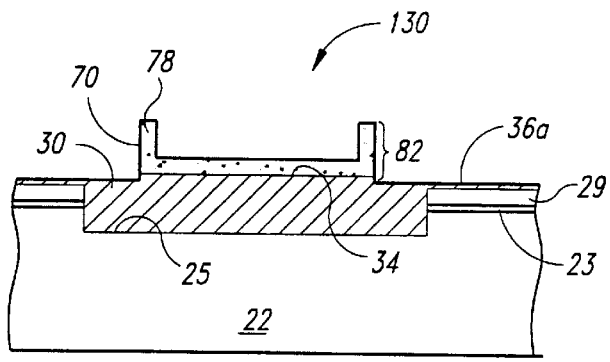
FIG. 15 is a partial schematic cross-sectional view of the film stack of FIG. 14 at another point in a method of the invention.
Figure 16:
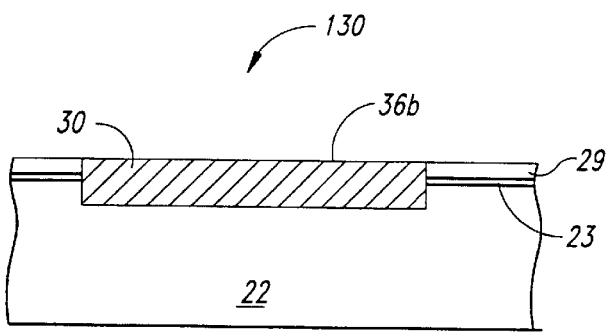
FIG. 16 is a partial schematic cross-sectional view of a finished surface over the low density field of FIG. 15 at another point in a method of the invention.

FIG. 15 illustrates a raised support feature 82 formed from the intermediate cover layer 70 by selectively etching the fill layer 30 around the intermediate cover layer 70. When the fill layer 30 and the upper cover layer 90 are made from the same material, the mask segment 96 of the upper layer 90 is removed from the wafer 130 as the fill layer 30 is etched. In this embodiment the raised support feature 82 includes a U-shaped basin 78 formed from the intermediate layer 70 and the portion of the fill layer 30 under the basin 78. When the fill layer 30 is selectively etchable with respect to the upper cover layer 90, the raised support feature. 82 includes the basin 78 formed from the intermediate layer 70 and the mask segment 96 of the upper layer 90 (not shown). As discussed above with respect to FIG. 1, FIG. 16 shows the wafer 130 after it has been planarized with a CMP process to form a finished surface 36(b) from the fill layer 30 in the trench 25.

The advantages of the raised support feature 82 are generally the same as those of the raised support feature 80 of the preferred embodiment of the invention discussed above with respect to FIGS. 2–11. One additional advantage of the raised support feature 82 is that CMP processes remove the hollow U-shaped basin 78 from the wafer faster than they remove the nearly solid raised support feature 80. Thus, by constructing the raised support feature 82 from the hollow U-shaped basin 78, CMP processing time and materials are generally reduced compared to the raised support feature 80.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming a planar surface using a self-aligned mask segment over a low density field on a semiconductor wafer having a contoured front face with a low region between high points, the method comprising:

depositing a fill layer over the front face of the wafer to substantially conform to the front face of the wafer, the fill layer having a depression over the low region, a top surface over the high points of the wafer, a bottom surface under the top surface, and a first depth defined by a first material between the top surface and the bottom surface, wherein the first material extends throughout the first depth between the top surface and the bottom surface;

covering the fill layer with a cover layer, the cover layer having an upper portion on the top surface of the fill layer and a lower portion in the depression;

removing a portion of the cover layer from the fill layer to form a mask segment from the lower portion of the cover layer and to expose the first material over the bottom surface of the fill layer, the mask segment being self-aligned with the low region;

removing portions of the fill layer adjacent to the mask segment to form a shoulder surface of the first material at an intermediate elevation of the first depth over the high points and to form a raised feature including the mask segment positioned over the low region, wherein at least a portion of the raised feature is higher than the shoulder surface; and further removing the first material at the shoulder surface, the mask segment and the raised feature using a chemical-mechanical planarizing process that terminates at the high points.

2. The method of claim 1 wherein depositing the fill layer comprises forming the fill layer of the first material in a single processing cycle.

3. The method of claim 1 wherein removing a portion of the cover layer comprises planarizing the cover layer.

4. The method of claim 1 wherein removing a portion of the cover layer comprises planarizing the cover layer and at least a portion of the top surface of the fill layer by chemical-mechanical planarization.

5. The method of claim 1 wherein removing a portion of the cover layer comprises etching the cover layer.

6. The method of claim 1 wherein removing a portion of the cover layer comprises etching the cover layer by spin etching an etchant on the cover layer.

7. The method of claim 1 wherein removing portions of the fill layer to form the shoulder surface at an intermediate elevation comprises etching the top surface of the first material of the fill layer with an etchant that selectively removes the first material faster than the mask segment.

8. The method of claim 1 wherein the first material of the fill layer comprises silicon oxide and the cover layer comprises polysilicon, and wherein removing portions of the fill layer to form the shoulder surface at an intermediate elevation comprises etching the fill layer from a top surface comprised of silicon oxide to a shoulder surface comprised of silicon oxide.

9. The method of claim 1, further comprising forming a stop-on-feature layer over the wafer before depositing the fill layer, and then depositing the fill layer onto the stop-on-feature layer, wherein the stop-on-feature layer is composed of a second material different than the first material of the fill layer, and wherein further removing the first material of the shoulder surface, the mask segment and the raised feature comprises terminating the chemical-mechanical planarizing process at the stop-on-feature layer.

10. The method of claim 1 wherein:
the method further comprises forming a stop-on-feature layer over the wafer before depositing the fill layer, wherein the stop-on-feature layer is composed of a second material different than the first material of the fill layer;
depositing the fill layer comprises depositing the first material onto the second material of the stop-on-feature layer; and
removing portions of the fill layer comprises etching the first material of the fill layer with an etchant that selectively removes the first material faster than the mask segment, and terminating etching of the first material of the fill layer before removing all of the first material of the fill layer over the high points so that the second material of the stop-on-feature layer is covered by a remaining portion of the first material.

11. The method of claim 1 wherein removing portions of the fill layer comprises:
etching the first material of the fill layer with an etchant that selectively removes the first material faster than the mask segment; and
terminating etching of the first material of the fill layer before removing all of the fill layer over the high points so that the shoulder surface is defined by an upper surface of the remaining portion of the first material over the high points.

12. A method for forming a planar surface using a self-aligned mask segment over a low density field on a semiconductor wafer having a contoured front face with a low region between high points, the method comprising:
depositing a first material over the front face of the wafer to form a fill layer that substantially conforms to the front face of the wafer, the fill layer having a depression over the low region, a top surface over the high points of the wafer, and a bottom surface under the top surface, wherein the first material extends between the top surface and the bottom surface;
covering the fill layer with a cover layer, the cover layer having an upper portion on the top surface of the fill layer and a lower portion in the depression;
removing a portion of the cover layer from the fill layer to form a mask segment from the lower portion of the cover layer and to expose the first material over the bottom surface of the fill layer, the mask segment being self-aligned with the low region;
removing portions of the fill layer adjacent to the mask segment to form a shoulder surface in the first material over the high points and to form a raised feature including the mask segment positioned over the low region, wherein the raised feature extends above the shoulder surface;
further removing the fill layer adjacent the mask segment, the raised feature, and the mask segment by chemically-mechanically planarizing the wafer; and
end-pointing the chemical-mechanical planarizing procedure at a stop-on-feature layer defining the high points.

13. The method of claim 12 wherein depositing the first material comprises forming the fill layer of the first material in a single processing cycle.

14. The method of claim 12 wherein removing a portion of the cover layer comprises planarizing the cover layer.

15. The method of claim 12 wherein removing a portion of the cover layer comprises planarizing the cover layer and at least a portion of the top surface of the fill layer by chemical-mechanical planarization.

16. The method of claim wherein removing a portion of the cover layer comprises etching the cover layer.

17. The method of claim 12 wherein removing a portion of the cover layer comprises etching the cover layer by spin etching an etchant on the cover layer.

18. The method of claim 12 wherein removing portions of the fill layer to form the shoulder surface comprises etching the top surface of the first material of the fill layer with an etchant that selectively removes the first material faster than the mask segment.

19. The method of claim 12 wherein the first material of the fill layer comprises silicon oxide and the cover layer comprises polysilicon, and wherein removing portions of the fill layer to form the shoulder surface comprises etching the fill layer from a top surface comprised of silicon oxide to a shoulder surface comprised of silicon oxide.

20. The method of claim 12 further comprising forming the stop-on-feature layer over the wafer before depositing the fill layer, and then depositing the fill layer onto the stop-on-feature layer, wherein the stop-on-feature layer is composed of a second material different than the first material of the fill layer.

21. A method for forming a planar surface using a self-aligned mask segment over a low density field on a semiconductor wafer having a contoured front face with a low region between high points, the method comprising:
depositing a first material over the front face of the wafer to form a fill layer that substantially conforms to the front face of the wafer, the fill layer having a depression over the low region, a top surface over the high points of the wafer, and a bottom surface under the top surface;
covering the fill layer with a cover layer, the cover layer having an upper portion on the top surface of the fill layer and a lower portion in the depression;

removing a portion of the cover layer from the fill layer to form a mask segment from the lower portion of the cover layer and to expose portions of the first material of the fill layer over the high points, the mask segment being self-aligned with the low region;

removing a thickness of the first material from the portions of the fill layer over the high points to form a shoulder surface of the first material over the bottom surface and to form a raised feature including the mask segment positioned over the low region, wherein the raised feature extends above the shoulder surface;

further removing the fill layer adjacent the mask segment, the raised feature and the mask segment by chemically-mechanically planarizing the wafer; and terminating the chemical-mechanical planarizing procedure after all of the first material over the high points has been removed by the chemical-mechanical planarizing procedure.

22. The method of claim 21 wherein depositing the first material comprises forming the fill layer of the first material in a single processing cycle.

23. The method of claim 21 wherein removing a portion of the cover layer comprises planarizing the cover layer.

24. The method of claim 21 wherein removing a portion of the cover layer comprises planarizing the cover layer and at least a portion of the top surface of the fill layer by chemical-mechanical planarization.

25. The method of claim 21 wherein removing a portion of the cover layer comprises etching the cover layer.

26. The method of claim 21 wherein removing a portion of the cover layer comprises etching the cover layer by spin etching an etchant on the cover layer.

27. The method of claim 21 wherein removing portions of the fill layer to form a shoulder surface comprises etching the top surface of the first material of the fill layer with an etchant that selectively removes the first material faster than the mask segment.

28. The method of claim 21 wherein the first material of the fill layer comprises silicon oxide and the cover layer comprises polysilicon, and wherein removing portions of the fill layer to form a shoulder surface comprises etching the fill layer from a top surface comprised of silicon oxide to a shoulder surface comprised of silicon oxide.

29. The method of claim 21, further comprising forming a stop-on-feature layer over the wafer before depositing the fill layer, and then depositing the fill layer onto the stop-on-feature layer, wherein the stop-on-feature layer is composed of a second material different than the first material of the fill layer and wherein terminating the chemical-mechanical planarizing procedure that removes the raised feature comprises stopping the chemical-mechanical planarizing procedure at the stop-on-feature layer.

30. The method of claim 21 wherein:

the method further comprises forming a stop-on-feature layer over the wafer before depositing the fill layer, wherein the stop-on-feature layer is composed of a second material different than the first material of the fill layer;

depositing the first material comprises depositing the first material onto the second material of the stop-on-feature layer; and removing portions of the fill layer comprises etching the first material of the fill layer with an etchant that selectively removes the first material faster than the mask segment, and terminating etching of the first material of the fill layer before removing all of the first material of the fill layer over the high points so that the second material of the stop-on-feature layer is covered by a remaining portion of the first material.

* * * * *

UNITED STATES PATENT AND TRADEMARK OFFICE
CERTIFICATE OF CORRECTION

PATENT NO.    : 6,395,620 B1                                           Page 1 of 1
DATED         : May 28, 2002
INVENTOR(S)   : Pan et al.

It is certified that error appears in the above-identified patent and that said Letters Patent is hereby corrected as shown below:

Column 1,
Line 13, insert comma between "process" and "a";

Column 3,
Line 13, insert period between "layer" and "The";

Column 8,
Line 9, delete period between "feature" and "82";
Line 12, "FIG. 1" should be -- FIG. 11 --;

Signed and Sealed this

Twenty-fourth Day of June, 2003

JAMES E. ROGAN
*Director of the United States Patent and Trademark Office*